United States Patent [19]

Sichmann

[11] Patent Number: 5,330,632
[45] Date of Patent: Jul. 19, 1994

[54] APPARATUS FOR CATHODE SPUTTERING

[75] Inventor: Eggo Sichmann, Gelnhausen, Fed. Rep. of Germany

[73] Assignee: Leybold Aktiengesellschaft, Hanau, Fed. Rep. of Germany

[21] Appl. No.: 967,136

[22] Filed: Oct. 27, 1992

[30] Foreign Application Priority Data

Jan. 29, 1992 [DE] Fed. Rep. of Germany ....... 4202349

[51] Int. Cl.[5] ............................................. C23C 14/34
[52] U.S. Cl. ........................ 204/298.18; 204/298.09; 204/298.14; 204/298.12; 204/298.17
[58] Field of Search ...................... 204/192.12, 298.09, 204/298.14, 298.18, 298.12, 298.17

[56] References Cited

U.S. PATENT DOCUMENTS

| 4,060,470 | 11/1977 | Clarke | 204/192 |
|---|---|---|---|
| 4,414,086 | 11/1983 | Lamont, Jr. | 204/298.18 X |
| 4,547,279 | 10/1985 | Kiyota et al. | 204/298.18 X |
| 4,604,180 | 8/1986 | Hirukawa et al. | 204/298 |
| 4,747,926 | 5/1988 | Shimuzu et al. | 204/298 |
| 4,842,703 | 6/1989 | Class et al. | 204/298.18 X |
| 4,933,064 | 6/1990 | Geisler et al. | 204/298 |
| 4,957,605 | 9/1990 | Hurwitt et al. | 204/192.12 |

FOREIGN PATENT DOCUMENTS

| 0330445 | 2/1989 | European Pat. Off. . |
|---|---|---|
| 0163445 | 1/1991 | European Pat. Off. . |
| 0450163 | 10/1991 | European Pat. Off. . |
| 2824289 | 6/1978 | Fed. Rep. of Germany . |
| 150482 | 9/1981 | German Democratic Rep. . |
| 63103068 | 10/1986 | Japan . |

Primary Examiner—Nam Nguyen
Attorney, Agent, or Firm—Felfe & Lynch

[57] ABSTRACT

A target has a front sputtering surface including an inner annular surface and an outer frustoconical surface which are concentric to an axis and adjoin at an angle to form a break. A ring of magnets and a first ring-like pole shoe outside the target, together with a second pole shoe inside the target and a yoke facing the back of the target, provide lines of flux through the target and arcuately over the front surface to form a first plasma ring over the break and a second plasma ring radially outside the break.

19 Claims, 1 Drawing Sheet

APPARATUS FOR CATHODE SPUTTERING

BACKGROUND OF THE INVENTION

The invention describes an apparatus for cathode sputtering for the production of thin coatings on a substrate by means of a plasma in a vacuum processing chamber, consisting essentially of magnets, pole shoes, an anode, a target configured as a cathode of the material to be sputtered, and a masking system.

For the production of thin coatings on a substrate, especially for coating compact disks, many different solutions are known in the state of the art.

For example, EP 0 163 445 describes a target set for an apparatus for vacuum sputtering, having a first and second cathode element of sputtering material, the second surrounding the first. The geometries of the first and second element are such that, when they are in the vacuum, material can be sputtered from the emitting surface of the second element, which surface lies outside that of the first element. The first target element is a ring-shaped cathode and the initial emitting surface of the second element is frustoconical.

U.S. Pat No. 4,747,926, also discloses a frustoconical target for use in a magnetron sputtering apparatus. A one-piece target is fixed to a backing plate and has two surface areas which run parallel to the central region of a planar substrate, and a third inclined area which joins the first and second areas. A magnetic field produces two plasmas of different diameters.

U.S. Pat. No. 4,933,064 discloses a sputtering cathode on the magnetron principle, with a target having at least two concentric projections whose wall surfaces are perpendicular to the sputtering surface. A permanent magnet system has soft-magnetic pole shoes, from whose pole faces magnetic lines of force pass through the projections and cross the sputtering surface.

The described prior art apparatus have several disadvantages. First, they require a relatively high electrical power for supplying the sputtering current. Second, they achieve an unsatisfactory sputtering efficiency, i.e., too much target material is deposited on shielding and masks instead of on the substrate. Third, the mechanical structure of the cathode is too complicated. Fourth, the sputtering current supply (SSV) is prone to arcing, and consequently the SSV frequently shuts down.

SUMMARY OF THE INVENTION

The invention is therefore addressed to the problem of minimizing the above disadvantages, and of making the apparatus safer to operate, more reliable, and less expensive to manufacture and to operate.

The front of the target to be sputtered, facing the substrate, is essentially roof-shaped, i.e. it has at least two concentric surfaces which adjoin at an angle to form a break, the perpendiculars to at least one surface intersect in front of the target. Only one set of magnets with pole shoes is used, and the faces of the pole shoes confronting the substrate are provided with a bevel.

A focused sputtering direction is achieved by the chosen target geometry. Consequently the percentage of the particles which deposit themselves on the substrate is increased, the portion that strikes the surrounding components is reduced, and the efficiency is thus measurably increased.

Due to the roof-shaped break in the target surface, an electrostatic inclusion of the electrons is achieved in this break, and thus also the conditions for the ignition of a first plasma ring are fulfilled.

Due to this "break," target flanks (known as interpole target (ZPT) cathodes) can be dispensed with. Thus the entire target surface is an actively sputtering surface and the danger of partial occupation of the target surface no longer exists.

By the clever conformation of the magnetic lines of force spanning the target, a secondary plasma can be produced. It forms as a second plasma ring concentric with the first plasma ring and produces a widening of the target erosion profile.

To increase the life of the target and keep the sputtering power low when the target is heavily eroded, the erosion profile that forms should be kept as wide as possible in relation to depth. For this reason, ring-shaped plates of nonmagnetic material are placed between target and yoke while maintaining the dark-space interval. The magnetic fields issuing vertically from the pole shoes are thereby made uniform in thickness on the target surface, which leads to the formation of wider erosion pits.

Due to the sloping of the pole shoes, the magnetic lines of force cross above the target surface at a certain angle, which usually is not parallel, as in the case of interpole target cathodes. On account of this inclination, the electrons are kept close to the target surface by magnetic influence only in the case of substantially new (not eroded) targets (electrons focused toward the center of the target).

As target erosion increases the sputtering process is influenced mainly by parallel lines of force and a wide erosion profile develops. As erosion advances, a "target wall" forms at the outside diameter of the target and produces the electrostatic enclosure of the electrons.

Only one set of magnets of like alignment of polarity is used for producing the entire magnetic field. A virtual counterpole automatically forms in the center of the cathode without requiring additional magnets. The strength of the magnetic field and its structure can be varied by optimation, by adjusting the axial distance between the pole shoe and magnet. Such an arrangement of the magnets is advantageously in the atmosphere; this reduces flashovers between cathode potential (target) and yoke potential, since magnets in the vacuum near the cathode potential are a frequent source of flashovers due to a great number of stray magnetic fields and voids.

In one embodiment, the anode and the components at anode potential consist essentially of the actual anode ring and a shielding ring. The anode is electrically insulated as part of the process chamber and is also cooled by only one cooling passage disposed on the atmosphere side, so that advantageously no coolant circuit is needed inside of the vacuum chamber.

The anode ring and the shielding ring are advantageously configured such that during the sputtering process only the shielding ring can be coated and the anode ring remains unaffected. The shielding ring is replaceable.

The necessary electric power input of the sputtering current power supply is decidedly reduced. In an experimental set-up which previously required about 30 kW, now, with the cathode arrangement according to the invention, needs only half the power or about 15 kW.

The target materials mostly used, especially in the coating of small substrates such as CD's, are aluminum and aluminum-copper alloys. With the invention herein described, a great variety of target materials can be considered for reactive sputtering.

DETAILED DESCRIPTION OF THE PREFERRED EMBODIMENT

Figure 1:
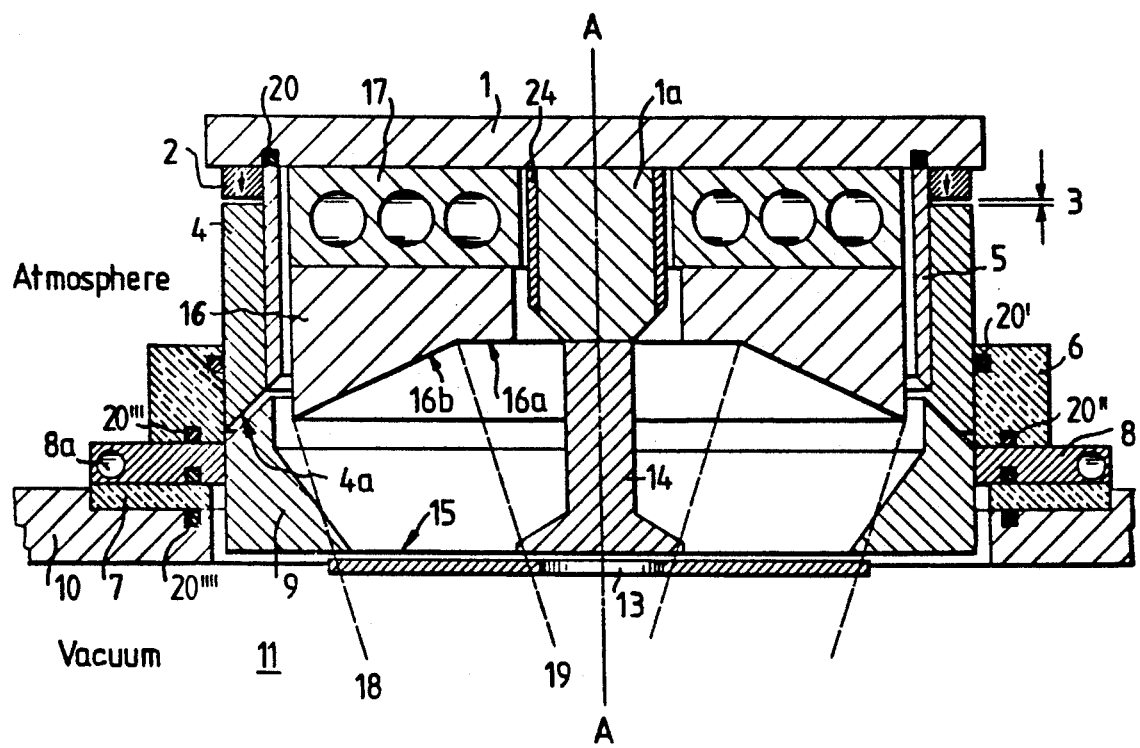
FIG. 1 is a partial section through a rotationally symmetrical cathode arrangement for coating small, disk-shaped substrates.

An essentially disk-shaped yoke 1 (FIG. 1) is provided with a central pole shoe 1a disposed in the direction of the axis of rotation A—A and on its outside with a ring magnet 2. A ring-like pole shoe 4 is spaced at a defined axial distance 3 from the magnet 2. The pole shoe 4 is supported by an inner metal ring 5 of nonmagnetic material, and has a chamfered end surface 4a facing the axis A—A. The pole shown 1a is surrounded by a sleeve 24 of non-magnetic material.

A ring-shaped anode 8 with a cooling passage 8a is fixed to pole shoe 4 by an insulating ring 6, and adjoins a shielding ring 9 in the radially inward direction. In the axial direction the anode 8 is joined to the chamber wall 10 of a vacuum processing chamber 11 by a further insulating ring 7. To shield the inside margin of the substrate 13 a central mask 14 is provided, which is connected to the central pole shoe 1a.

The shielding ring 9 serving as a mask and the central mask 14 form a ring-shaped opening 15 by which the disk-shaped substrate 13 is positioned for coating.

The target 16 to be sputtered is concentric to the axis A—A and joined to the yoke 1 by a cooled base plate 17. The target 16 has on its surface facing the substrate 13 a break, which is formed by the intersection between an inwardly situated annular area 16a running parallel to the substrate surface and a radially outlying area 16b directly adjoining it. The outlying area 16b has a frustoconical surface which is inclined relative to the inner surface 16a and faces the axis A—A.

The target material sputtered off from this area 16b is thus focused toward the substrate 13. The main sputtering direction is marked by the two lines 18 and 19 which are substantially perpendicular on the surface of the outer area 16b and point toward the axis A—A.

The components 4, 5, 6, 7 and 8 which radially surround the target 16 are joined together hermetically by sealing rings 20, 20', ... and together with the chamber wall 10 and the yoke 1 form a vacuum chamber surrounding the target 16. This makes it possible for the ring magnet 2 to be in the atmosphere and the cooling of the anode 8 is provided from the atmosphere side.

Figure 2:
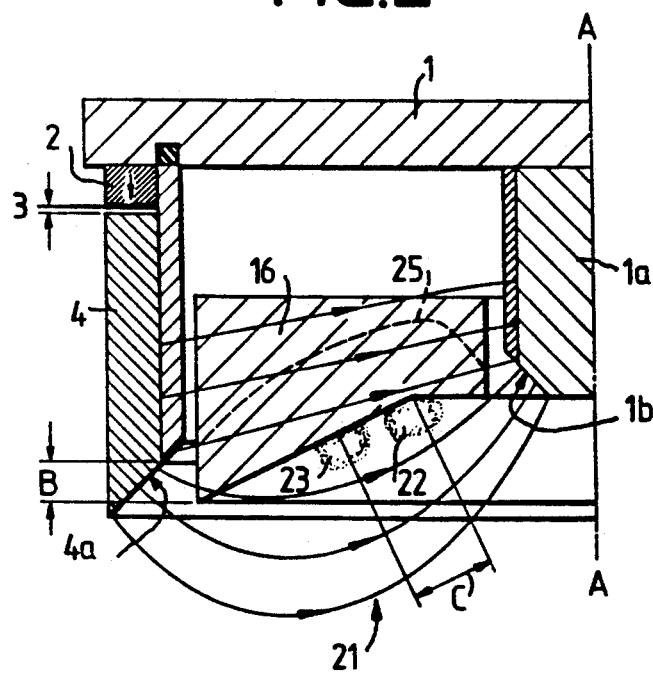
FIG. 2 is a simplified representation of the magnetic lines of force in a cathode arrangement according to FIG. 1.

In FIG. 2, some of the components already shown in FIG. 1 are again represented in part, and are helpful in explaining the principle of operation of the cathode system in accordance with the invention.

The yoke 1 and the pole shoe 1a are made of ferromagnetic material. A single ring magnet 2 serves to produce the entire magnetic field 21, pole shoe 1a being automatically configured as a virtual counterpole without requiring additional magnets. The magnetic lines of force 21 issue on the one hand from the face 4a of the pole shoe 4 and run arcuately in front of the target 16 to the face 1b of pole shoe 1a. On the other hand, part of the magnetic lines of force 21 issue laterally from the pole shoe 4, penetrate the target 16 approximately in a straight line, and enter the pole shoe 1a laterally.

Owing to the slope of the faces 1b and 4a of the respective pole shoes 1a and 4, the lines of force 21 run at a defined angle to the target surface. This causes the electrostatic enclosure of electrons close to the target surface, which is necessary in order to achieve conditions for the ignition of the cathode sputtering process. This condition first exists in the break between the inner region 16a and the sloping outer region 16b of target 16, so that a first plasma ring 22 is formed here first.

In the illustrated configuration of the magnetic field 21 the null of the magnetic lines of force 21 is situated approximately in the first radially inward half of the sloping portion 16b of the target surface, so that here a second plasma ring 23 is formed. As target erosion increases, the sputtering process is influenced mainly by parallel lines of force and a wide erosion profile 25 develops.

The strength as well as the structure of the magnetic field 21 can be varied by varying the distance 3 between magnet 2 and pole shoe 4.

I claim:

1. Cathode sputtering apparatus comprising
a target having a front to be sputtered, an opposing back, and a central aperture with an axis therethrough, said front having an inner annular surface and an outer frustoconical surface which are concentric to said axis and adjoin at an angle to form a break, said outer frustoconical surface facing said axis,
a yoke facing the back of said target and extending radially to outside of said target,
magnet means associated with said yoke at only one of radially outside said target and radially inside said central aperture,
first pole shoe means extending axially from said magnet means to a first end surface, said first pole shoe means being separated from said magnet means by a gap,
second pole shoe means associated with said yoke at the other of radially outside said target and radially inside said central aperture, said second pole shoe means extending axially from said yoke to a second end surface, said first and second end surfaces being arranged to provide arcuate lines of magnetic flux extending over the front of said target.

2. Cathode sputtering apparatus as in claim 1 wherein at least one of said end surfaces is a bevelled surface.

3. Cathode sputtering apparatus as in claim 1 wherein said magnet means consists of individual magnets having like alignment of polarity.

4. Cathode sputtering apparatus as in claim 1 wherein said magnet means is situated radially outside said target.

5. Cathode sputtering means as in claim 4 further comprising a processing chamber having a vacuum side and an atmosphere side, said target being situated on the vacuum side, said magnet means being situated on the atmosphere side.

6. Cathode sputtering apparatus as in claim 4 wherein said first end surface is a bevelled surface having a radially inside edge and a radially outside edge, said outside edge extending axially further from said magnet means than said inside edge, and
said outer frustoconical surface of said target has an outside edge which is axially further from said magnet than said inside edge of said first end surface.

7. Cathode sputtering apparatus as in claim 1 further comprising a ring of non-magnetic material between said target and the pole shoe means radially outside said target.

8. Cathode sputtering apparatus as in claim 7 wherein said ring of non-magnetic material is situated in a dark space between the target and said pole shoe means radially outside said target.

9. Cathode sputtering apparatus as in claim 1 further comprising a ring of non-magnetic material between said target and the pole shoe means inside the central aperture.

10. Cathode sputtering apparatus as in claim 9 wherein said ring of non-magnetic material is situated in a dark space between said target and said pole shoe means.

11. Cathode sputtering apparatus as in claim 9 further comprising a processing chamber having wall means for separating vacuum from atmosphere, said wall means comprising said yoke, said ring of non-magnetic material, said pole shoe means outside said target, an anode, a ring of insulation between said anode and said pole shoe means, a chamber wall, and a ring of insulation between said anode and said chamber wall.

12. Cathode sputtering apparatus as in claim 1 further comprising an anode ring having cooling means therein.

13. Cathode sputtering means as in claim 1 further comprising an anode ring and a shielding ring adjoining said anode ring radially inwardly of said anode ring.

14. Cathode sputtering apparatus as in claim 1 wherein said magnet means is situated radially outside said target, said apparatus further comprising a ring of non-magnetic material between said target and the first pole shoe means, a ring of non-magnetic material between the target and the second pole shoe means, and an anode at common potential with the magnet means, the yoke, the first and second pole shoe means, and the non-magnetic rings.

15. Cathode sputtering apparatus as in claim 1 wherein the magnet means and the pole shoe means are arranged so that a first plasma forms over the break on the front of the target.

16. Cathode sputtering arrangement as in claim 15 wherein the magnet means and the pole shoe means are arranged so that a second plasma forms over the outer frustoconical surface radially outside of said first plasma.

17. Cathode sputtering arrangement as in claim 16 wherein said first and second end surfaces are arranged so that said magnetic lines of flux are parallel to said outer frustoconical surface on a perpendicular to said outer frustoconical surface which lies radially outside a perpendicular to said outer frustoconical surface at said break.

18. Cathode sputtering apparatus as in claim 1 wherein said inner annular surface is planar surface perpendicular to said axis.

19. Cathode sputtering apparatus comprising
a rotationally symmetric target having a front to be sputtered and a central aperture with an axis of symmetry therethrough, said front having a flat inner annular surface defining said aperture and an outer frustoconical surface which are concentric to said axis and join at an angle to from a break, said outer frustoconical surface facing said axis,
means for forming a first plasma ring over said break, and
means for forming a second plasma ring over said outer frustoconical surface and concentric to said first plasma ring.

* * * * *